US012772840B2

(12) United States Patent
Radic et al.

(10) Patent No.: US 12,772,840 B2
(45) Date of Patent: Oct. 20, 2026

(54) TRANSISTOR HEAT DISSIPATION STRUCTURE

(71) Applicant: NXP B.V., Eindhoven (NL)

(72) Inventors: Ljubo Radic, Gilbert, AZ (US); Richard Emil Sweeney, Chandler, AZ (US); Vikas Shilimkar, Chandler, AZ (US); Bernhard Grote, Phoenix, AZ (US); Darrell Glenn Hill, Chandler, AZ (US); Ibrahim Khalil, Gilbert, AZ (US)

(73) Assignee: NXP B.V., Eindhoven (NL)

( * ) Notice: Subject to any disclaimer, the term of this patent is extended or adjusted under 35 U.S.C. 154(b) by 739 days.

(21) Appl. No.: 17/818,607

(22) Filed: Aug. 9, 2022

(65) Prior Publication Data

US 2024/0055314 A1 Feb. 15, 2024

(51) Int. Cl.

| | |
|---|---|
| ***H10W 40/22*** | (2026.01) |
| ***H10D 30/47*** | (2025.01) |
| ***H10D 62/85*** | (2025.01) |
| ***H10W 40/00*** | (2026.01) |
| ***H10W 40/10*** | (2026.01) |

(52) U.S. Cl.

CPC .......... *H10W 40/22* (2026.01); *H10D 30/475* (2025.01); *H10D 62/8503* (2025.01); *H10W 40/00* (2026.01); *H10W 40/10* (2026.01)

(58) Field of Classification Search

CPC ....... H01L 23/367; H01L 23/34; H01L 23/36; H10D 30/475; H10D 62/8503; H10W 40/22; H10W 40/00; H10W 40/10

See application file for complete search history.

(56) References Cited

U.S. PATENT DOCUMENTS

| | | | | |
|---|---|---|---|---|
| 8,487,375 | B2 | 7/2013 | Okamoto | |
| 9,147,632 | B2 * | 9/2015 | Ritenour | H01L 21/02378 |
| 9,640,632 | B2 | 5/2017 | Ritenour | |
| 10,629,526 | B1 | 4/2020 | Hill | |
| 10,879,168 | B2 | 12/2020 | Hill | |
| 2014/0042448 | A1 * | 2/2014 | Ostermaier | H10D 30/015 257/E21.409 |

(Continued)

FOREIGN PATENT DOCUMENTS

| | | | |
|---|---|---|---|
| CN | 114582972 | A | 6/2022 |
| JP | 2010-28038 | A | 2/2010 |

*Primary Examiner* — William B Partridge
*Assistant Examiner* — Heim Kirin Grewal

(57) ABSTRACT

A transistor includes a semiconductor substrate, a channel region on a top surface of the semiconductor substrate, first and second current terminals with first and second contacts at a top surface of the channel region, a gate electrode between the first and second contacts, and a cooling trench. The cooling trench is coupled to the first current terminal, and the cooling trench extends laterally from a first end of the cooling trench to a second end of the cooling trench along a first direction that is parallel to the top surface of the substrate. The cooling trench also extends vertically from the first current terminal through the channel region, through the top surface of the semiconductor substrate and toward, but not to, the backside of the semiconductor substrate. The cooling trench is filled throughout with a thermally-conductive material configured to dissipate heat from the channel region into the semiconductor substrate.

19 Claims, 4 Drawing Sheets

(56) References Cited

U.S. PATENT DOCUMENTS

| | | | | |
|---|---|---|---|---|
| 2014/0264453 | A1* | 9/2014 | Moens | H01L 23/49575 257/194 |
| 2016/0020313 | A1* | 1/2016 | Wu | H10D 62/824 257/194 |
| 2017/0263528 | A1 | 9/2017 | Yoshida et al. | |
| 2017/0287811 | A1 | 10/2017 | Pei et al. | |
| 2018/0212047 | A1* | 7/2018 | Chang | H10D 30/015 |
| 2022/0208975 | A1* | 6/2022 | Khalil | H10D 62/8503 |
| 2023/0075505 | A1* | 3/2023 | Radulescu | H10D 64/257 |
| 2023/0411461 | A1* | 12/2023 | Lee | H10D 30/475 |

* cited by examiner

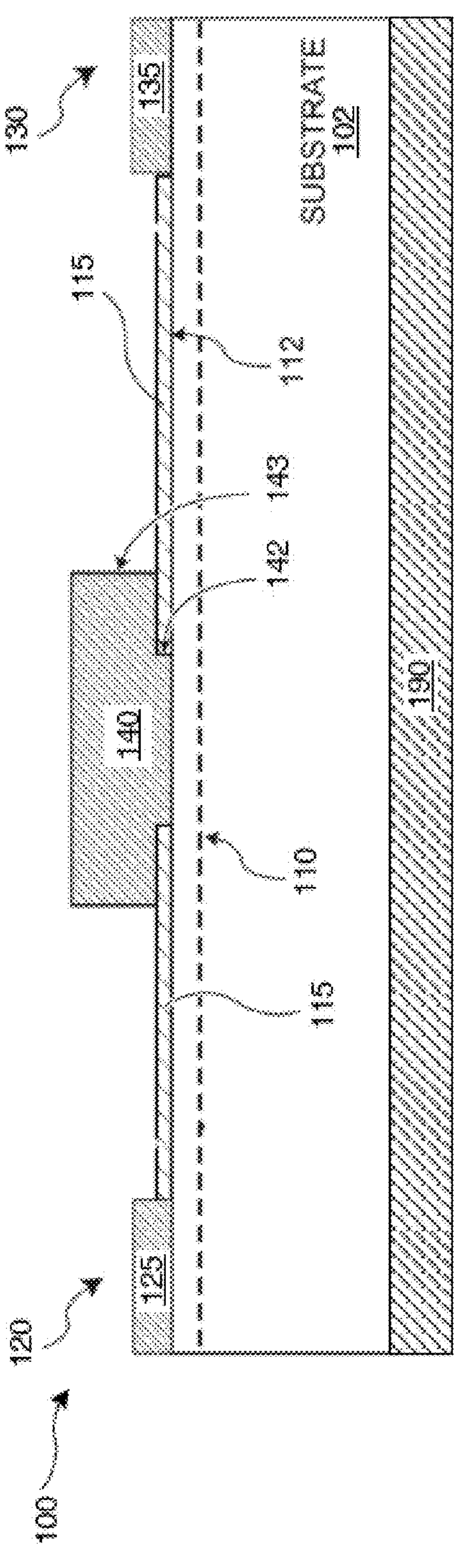
FIG. 1A -PRIOR ART-
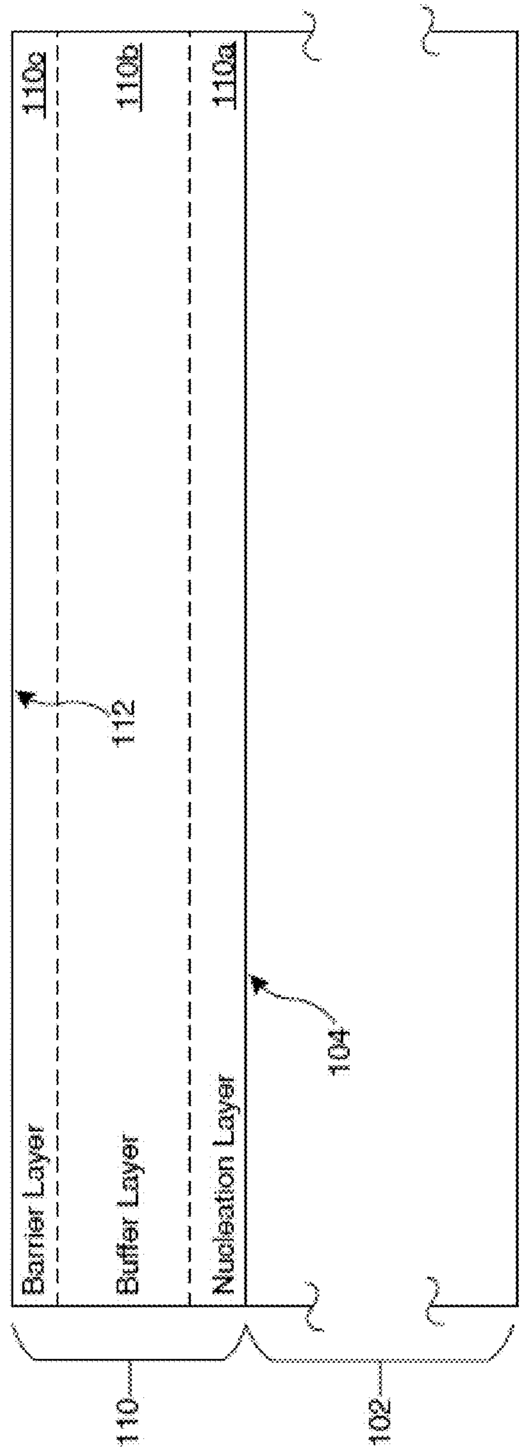
FIG. 1B -PRIOR ART-

TRANSISTOR HEAT DISSIPATION STRUCTURE

FIELD OF THE INVENTION

Embodiments of the subject matter described herein relate to field-effect transistors and methods of fabrication of such transistors.

BACKGROUND OF THE INVENTION

Transistor-based circuits are often used for analog signal processing applications including amplification of radio and microwave-frequency (RFMW) signals and for power-switching. Advanced transistor designs and high-performance materials such as III-V semiconductors have been used to achieve increased power densities while providing acceptable thermal performance and voltage-induced breakdown characteristics. However, highly-scaled devices may be more susceptible to leakage, breakdown, and other problems. Transistors based on Gallium Nitride (GaN) and/or other compound semiconductors are often used in applications where highly-scaled silicon transistors cannot provide adequate switching speeds or power handling capabilities.

SUMMARY OF THE INVENTION

In an example embodiment, a transistor device includes a portion of an electrically-insulating semiconductor substrate having a top surface and a bottom surface; a first current terminal; a second current terminal; a channel region formed above the top surface of the semiconductor substrate that is configured to provide an electrically conductive path between the first current terminal and the second current terminal; an elongated gate electrode disposed above the channel region that extends laterally from a first end of the gate electrode to a second end of the gate electrode in a first direction that is parallel to the top surface of the semiconductor substrate; and a first elongated cooling trench coupled to the first current terminal that extends laterally from a first end to a second end of the first elongated cooling trench along the first direction and extends vertically from the first current terminal and through the top surface into the semiconductor substrate. The first elongated cooling trench is filled throughout with a thermally-conductive material configured to dissipate heat from the channel region into the semiconductor substrate.

In another example embodiment, a method of fabricating a transistor includes providing an electrically-insulating semiconductor substrate and forming a first elongated cooling trench. The substrate has a top surface and a bottom surface; a first current terminal; a second current terminal; a channel region formed above the top surface of the semiconductor substrate that is configured to provide an electrically conductive path between the first current terminal and the second current terminal; and an elongated gate electrode disposed above the channel region that extends laterally from a first end of the gate electrode to a second end of the gate electrode in a first direction that is parallel to the top surface of the semiconductor substrate. The first elongated cooling trench coupled to the first current terminal that extends laterally from a first end to a second end of the first elongated cooling trench along the first direction and extends vertically from the first current terminal and through the top surface into the semiconductor substrate. The first elongated trench is filled throughout with a thermally-conductive material configured to dissipate heat from the channel region into the semiconductor substrate.

BRIEF DESCRIPTION OF THE SEVERAL VIEWS OF THE DRAWINGS

The present disclosure is illustrated by way of examples, embodiments, and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

FIG. 1A is a cross-sectional schematic view of an example transistor.

FIG. 1B is a cross-sectional schematic view showing features of the transistor of FIG. 1A in greater detail.

DETAILED DESCRIPTION

Figure 2A:
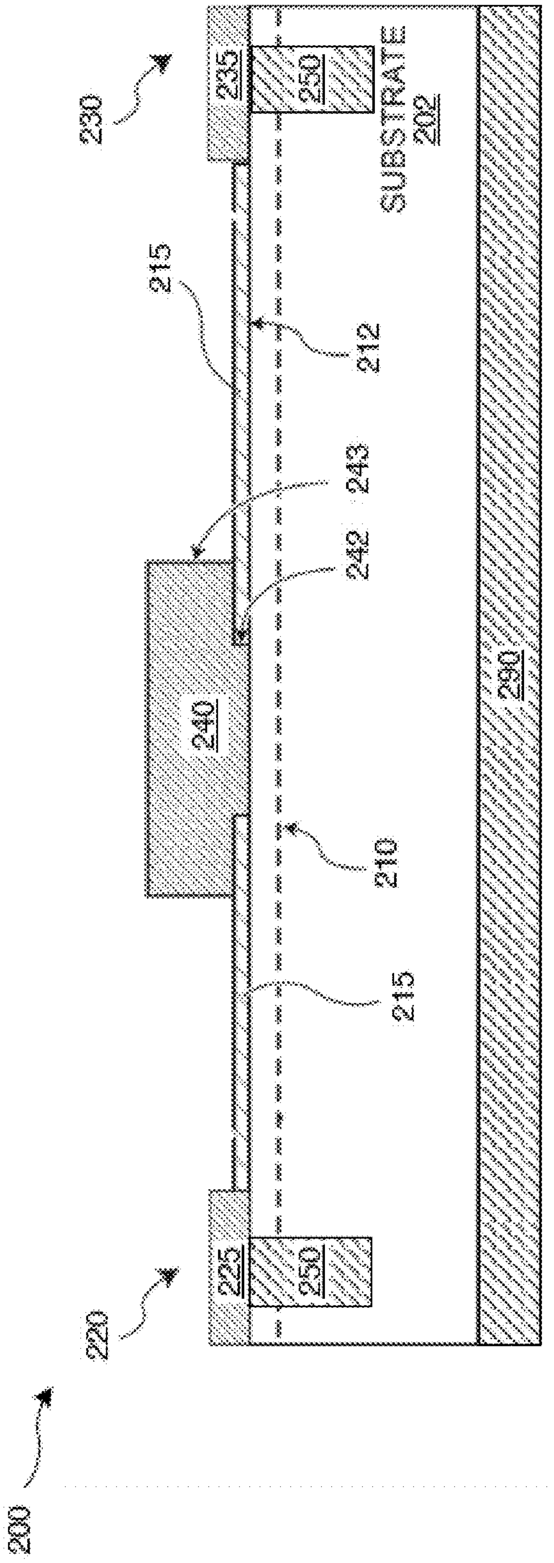
FIG. 2A is a cross-sectional schematic view of an example transistor that is provided with one or more cooling trenches according to embodiments herein.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms “first,” “second,” “third,” “fourth” and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms “comprise,” “include,” “have” and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation, and are made with reference to the orientation of the corresponding figure or figures for purposes of illustration.

It will be appreciated that the steps of various processes described herein are non-limiting examples of suitable processes according to embodiments and are for the purposes of illustration. Systems and devices according to embodiments herein may use any suitable processes including those that omit steps described herein, perform those steps and similar steps in different orders, and the like. It will also be appreciated that well-known steps or other well-known process features may be omitted for clarity.

FIG. 1A is a cross-sectional schematic view of an example transistor 100. The transistor 100 is formed on a semiconductor substrate 102 and has a channel region 110 near a top surface 112 of the substrate 102. The transistor 100 includes a first current terminal 120 (provided with a contact 125 which may be a metal or other suitable electrically conductive material) electrically coupled to a first end of the channel region 110 and a second current terminal 130 (provided with a contact 135) electrically coupled to a second end of the channel region 110 opposite the first current terminal 120. The transistor 100 also has a control terminal (a gate electrode 140) disposed above the channel region 110 in between the first current terminal 120 and the second current terminal 130. A dielectric material 115 is disposed above the top surface 112 overlying the channel region 110. The first current terminal 120 and the second current terminal 130 may be formed by any suitable method. For example, they may be appropriately doped regions within the semiconductor substrate 102, or as metallic contacts deposited within recesses in the substrate 102 or on the surface of the substrate 102 (e.g., the contact 125 and the contact 135).

The gate electrode 140 contacts the channel region 110 through an aperture in the dielectric material 115. As shown, the gate electrode 140 may have a first portion 142 that contacts the channel region 110 within the aperture and optionally may have a second portion 143 that overhangs the dielectric material 115. Although the gate electrode 140 is depicted as having vertical sidewalls, it will be understood that the gate electrode 140 and similar structures herein may have any suitable geometry. For instance, the first portion 142 of the gate electrode 140 may have sidewalls that are curved or slanted. Similarly, the second portion 143 of the gate electrode 140 may have sidewalls that are curved or slanted and the top of the gate electrode 140 (farthest from the channel region 110) may have any suitable geometry.

It will be appreciated that the first current terminal 120 may be operated, for example, as a source terminal of the transistor 100 and the second current terminal 130 may be operated, for example, as a drain terminal of the transistor 100. It also be understood that the gate electrode 140 is suitable for use as a gate electrode of the transistor 100 such that, when a suitable bias voltage is applied to the gate electrode 140, the channel region 110 is configured to provide an electrically conductive path between the first current terminal 120 and the second current terminal 130. The backside of the substrate 102 can be electrically conductive and, as shown, may include a backside metallization layer 190 which can be bonded to a heat sink. In some applications the backside of the substrate 102 may also be connected to the source or drain terminal of transistors using through-wafer vias.

The transistor 100 above (and transistors according to embodiments herein) may represent transistors implemented using various transistor technologies. For instance, example transistors described according to embodiments herein may be metal-MOSFETs or MISFETs fabricated on a silicon substrate or any other suitable semiconductor substrate. For instance, the transistor 100 may be a III-V compound semiconductor-based high electron-mobility transistor ("HEMT"), otherwise known as a heterostructure field effect transistor ("HFET"). In such transistors the effective semiconductor channel may be a 2D electron gas ("2DEG") formed at a semiconductor heterojunction disposed with the channel region 110 according to known techniques. Along these lines, the transistor 100 may be a gallium-nitride (GaN) based HEMT. In some such embodiments, a 2DEG is formed at an interface between a GaN layer and an aluminum doped layer with a stochiometric composition described by the chemical formula $Al_xGa_{1-x}N$. In such embodiments it will be understood that the effective channel may be buried within the channel region 110 and may not extend to the top surface 112 of the substrate above the channel region 110. In some embodiments, the dielectric material 115 may be a material that provides surface passivation for the channel region 110. For instance, the dielectric material 115 may be a silicon nitride passivation layer over a GaN-based heterostructure. It will be further understood that, in embodiments herein where a channel region such as the channel region 110 is formed by a semiconductor heterostructure (as illustrated in FIG. 1B), that the top surface of a semiconductor substrate (e.g., the semiconductor substrate 102) will be defined herein for the purposes of a surface of the substrate above which the heterostructure is formed, as opposed the top surface 112 of the channel region 110.

FIG. 1B is cross-sectional schematic view of a channel region 110 formed on the substrate 102 from a semiconductor heterostructure that includes three layers which will be described in the context of a GaN HEMT as an example. In this simplified example, the channel region 110 is formed from a nucleation layer 110*a* (e.g., a layer of aluminum nitride) formed on the top surface 104 of the substrate 102, followed a by a buffer layer 110*b* (e.g., an epitaxial layer of gallium nitride), and a barrier layer 110*c* (e.g., an insulating aluminum nitride/gallium nitride alloy) in which a 2DEG is formed at the interface between the buffer layer 110*b* and the barrier layer 110*c*. Typically, for GaN HEMT devices, the substrate 102 may be silicon, silicon carbide, sapphire or any other suitable material).

It will be understood that the example transistor 100 as shown in FIG. 1A and may omit certain features that depend upon the underlying semiconductor technology used to realize the example transistor 100. For example, if the example transistor 100 is a HEMT and the channel region 110 is as shown in FIG. 1B, then contact 125 and the contact 135 may be configured to extend below the top surface 112 of the channel region 110 in order to contact the 2DEG formed at the interface between the barrier layer 110*c* and the buffer layer 110*b*.

HEMTs and similar transistors with structures similar to the transistor 100 with a channel similar to the channel region 110 as depicted in FIG. 1B may have disadvantages in particular applications. Specifically, the substrate 102 and the buffer layer 110*b* will often have different crystal lattice structures, with mismatched lattice spacings. In such devices, the nucleation layer 110*a* functions as a transition between the crystal lattice of the substrate 102 and the crystal lattice of the buffer layer 110*b*. As a result, the nucleation layer 110*a* will tend to have a high density of crystal lattice defects (e.g., dislocations). Such lattice defects result in reduced thermal conductivity when compared to the conductivity of a bulk crystal of the same material(s). Such reduced thermal conductivity can mean that the nucleation layer 110*a* becomes a thermal barrier that impedes heat transfer from the channel region 110 into the substrate 102, resulting in undesirable current-induced heating of the channel region 110 during operation of the transistor 100.

In some transistors the source or drain may be coupled to a conductive layer such as the backside metallization layer 190 shown in FIG. 1A that can help dissipate current-induced heating. However, conventional through-wafer via techniques may not provide adequate thermal conductivity to protect HEMT devices from degraded performance or premature failure. For example, although conventional through-wafer vias may have diameters greater than 20 μm, they are often hollow, with metallization on the via walls only. Thus, conventional vias often result in decreased thermal conductivity compared to embodiments herein. Furthermore, typical through wafer source or drain vias are often spaced too far apart from each other to effectively remove heat from the channel region beneath the transistor gate of the example transistor 100 (e.g., from portions of the channel region 110 directly underneath and adjacent to the gate electrode 140 of the transistor 100) due to the thermal conductivity challenges explained above. Furthermore, in one or more embodiments herein the placement of cooling trenches differs from conventional contact vias.

Accordingly, FIG. 2A shows a cross-sectional schematic view of an example transistor 200 provided with two cooling trenches 250 according to embodiments herein. These cooling trenches may be designed to improve upon the heat dissipation capacity in two ways. First, they provide solid masses that provide a high thermal conductivity path from the channel region to the underlying substrate. Second, they may be made long enough to facilitate lateral heat transfer "around" areas with high dislocation densities.

Analogously to the transistor 100, the transistor 200 is formed on a substrate 202 (e.g., a semiconductor substrate 102) with a channel region 210 (e.g., a channel region 110) having a top surface 212, a source terminal 220 (e.g., a first current terminal 120) with a contact 225 (e.g., a contact 125) and a drain terminal 230 (e.g., a second current terminal 130) with a contact 235 (e.g., a contact 135), as well as a gate electrode 240 (e.g., a gate electrode 140) and a dielectric material 215 (e.g., a dielectric material 115) over the channel region 210. As shown, the gate electrode 240 has a first portion 242 in direct contact with the top surface 212 of the channel region 210 and a second portion 243 that is wider than first portion 242 and contacts the dielectric material 215. However, it will be understood that, in one or more embodiments, the gate electrode 240 has different shapes. It will be further understood that, in one or more embodiments (e.g., embodiments in which the example transistor 200 is a HEMT with an insulating barrier layer (e.g., a barrier layer 110*c*) underneath the gate electrode 240, the dielectric material 215 is absent.

As shown in FIG. 2A, the example transistor 200 includes cooling trenches 250 that are directly physically coupled, respectively, to the contact 225 of the source terminal 220 and the contact 235 of the drain terminal 230. The cooling trenches 250 are formed of any suitable thermally conductive material. In or more embodiments, as shown, the cooling trenches 250 are also electrically conductive and formed from any suitably metallic material including gold, tungsten, copper, aluminum, titanium, and the like; and/or alloys and other combinations thereof, as nonlimiting examples. In one or more embodiments, the cooling trenches 250 also provide respective electrically conductive paths between a 2DEG formed beneath the top surface 212 of the channel region 210 and the contact 225 of the source terminal 220 and the contact 235 of the drain terminal 230.

In one or more alternate embodiments, the cooling trenches 250 are thermally, but not electrically coupled to the source and drain terminals. In one or more such embodiments, when the transistor is in an cony state, less than 10% of the current flowing from source to drain passes through the cooling trenches 250. In one or more such embodiments, when the transistor is in an cony state, less than 5% of the current flowing from source to drain passes through the cooling trenches 250. In one or more such embodiments, when the transistor is in an cony state, less than 1% of the current flowing from source to drain passes through the cooling trenches 250.

In one or more embodiments, at least one cooling trench 250 is lined with an electrically insulating material to electrically isolate them from the current terminals (the source terminal 220 and the drain terminal 230), and/or the channel region. In one or more embodiments the interface between at least one cooling trench 250 and the surrounding semiconductor material is characterized by a high Schottky barrier such that no Ohmic contact is formed between the material of the trench and the semiconductor material. In one or more embodiments, at least one cooling trench 250 contains multiple metal layers in contact which each other. For example, a thin layer of a first metal with a relatively high work function (e.g., platinum) may be used near the top surface 212, and a second metal with a lower work function and high thermal conductivity (e.g., gold) may be used beneath the first layer.

It will be appreciated that the cooling trenches 250 are not shown to scale in FIG. 2A. Accordingly, in one or more embodiments, a cooling trench 250 may extend a limited distance into the substrate 202 including, as non-limiting examples, distances less than 10 μm, distances less than 5 μm, distances less than 1 μm, and the like. It will be further understood that in or more embodiments, one of the cooling trenches 250 is absent (i.e., in one or more embodiments, a cooling trench is present only near the source terminal 220 and in one or more embodiments a cooling trench 250 is present only near the drain terminal 230). In one more embodiments, a cooling trench 250 extends a minimum distance into the substrate. In or more such embodiments, the cooling trench 250 extends to a depth beyond a depth of a semiconductor heterostructure (e.g., the heterostructure 110). In one or more such embodiments, the cooling trench 250 extends to a minimum depth beyond the bottom of the heterostructure. For example, in or more embodiments, the cooling trench 250 extends at least 100 nm beyond the bottom layer of the heterostructure. It will be understood that any suitable minimum depth of a cooling trench 250 may be used. Thus, in one or more embodiments, the cooling trench 250 extends at least 200 nm, 300 nm, 400 nm, 500 nm, or any other suitable distance beyond the bottom of the heterostructure. In one or embodiments, the semiconductor heterostructure is selectively removed in the area of the cooling trench (e.g., by etching or any other suitable process) such that the cooling trench passes through the heterostructure and/or contacts a side of the heterostructure along a vertical direction that is perpendicular to the top surface 212.

Furthermore, it will be understood that arrangements of cooling trenches 250 other than those depicted may be used in or more embodiments. For example, a series of cooling trenches 250 may be used on either side of the gate electrode 240 and these trenches may be arranged along a single line or arranged in a staggered fashion. Similarly, in one or more embodiments cooling trenches 250 are present on both sides of the gate electrode 240 and the cooling trenches 250 on each side of the gate electrode 240 are arranged symmetrically or asymmetrically with respect to the gate electrode 240.

Figure 2B:
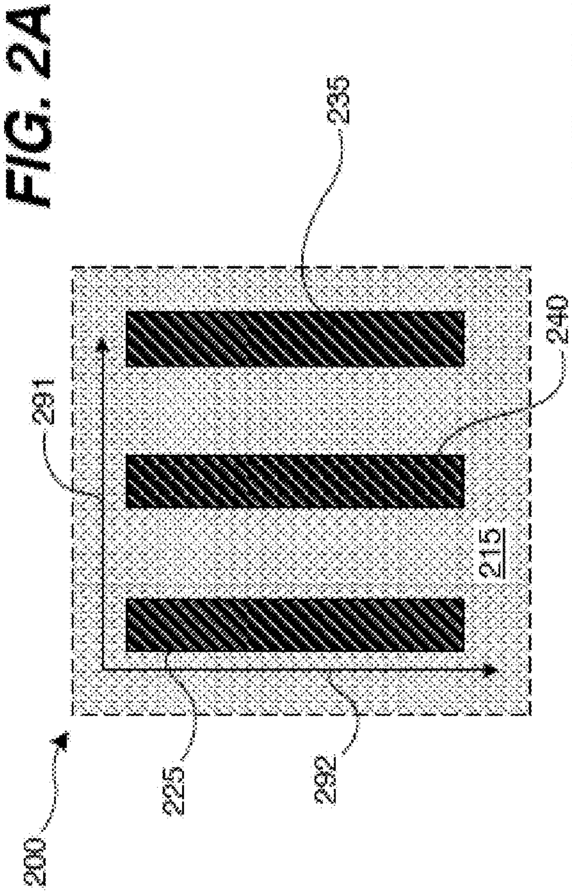
FIG. 2B is an overhead plan view of the transistor of FIG. 2A.

FIG. 2B is an overhead plan view of the example transistor 200 in which the contact 225, the contact 235 and the gate electrode 240 can be seen. As shown, in one or more embodiments each of the contact 225, the contact 235, and the gate electrode 240 are arranged side by side and current will flow in the direction indicated by the arrow 291. Each contact (including the gate electrode 240 as a "contact") is elongated and extends in a direction perpendicular to the current flow indicated by the arrow 292. It will be understood that in various embodiments, the width of the channel region 210 in the area between the source terminal 220 and the drain terminal 230 can be varied to support a desired current handling capacity. Furthermore, it will be understood that the width and aspect ratios of the contact 225, the contact 235, the gate electrode 240 and a cooling trench 250 may vary. Accordingly, in one or more embodiments, at least one cooling trench 250 has a width of at least 500 nm.

In one or more embodiments, at least one cooling trench 250 has an aspect ratio (i.e., a ratio of the length along the direction indicated by the arrow 292 to the width along the direction indicated by the arrow 291) much greater than one (e.g., 5, 10, 20, or larger). In one or more embodiments, at least one cooling trench 250 is as long as an adjacent gate electrode 240 or longer. In one or more embodiments, multiple cooling trenches 250 are present adjacent to a gate 240 (i.e., multiple cooling trenches 250 are disposed along the direction 292 with gaps in between them where no cooling trench is present). In one or more such embodiments, one or more cooling trenches have a dimension along the direction 292 of at least 1 μm. In one or more such embodiments, one or more cooling trenches have a dimension along the direction 292 of at least 2 μm. In one or more such embodiments, one or more cooling trenches have a dimension along the direction 292 of at least 5 μm. In one or more such embodiments, one or more cooling trenches have a dimension along the direction 292 of at least 10 μm. In one or more such embodiments, one or more cooling trenches have a dimension along the direction 292 of at least 20 μm. It will be appreciated that, in the transistor 200, as pictured in FIG. 2B, current will flow substantially parallel to the direction 291 and substantially perpendicular to the direction 292 when an appropriate bias voltage is applied between the drain and source and the gate is biased such that the transistor is in the cony state.

It will be understood that transistors according to embodiments herein are not limited to only the features shown and may have additional features, including additional dielectric layers and electrical interconnects. In addition, in or more or more embodiments, a transistor includes one or more field plate electrodes including, but not limited to a gate-connected field plate, a source-connected field plate, or the like.

Figure 3:
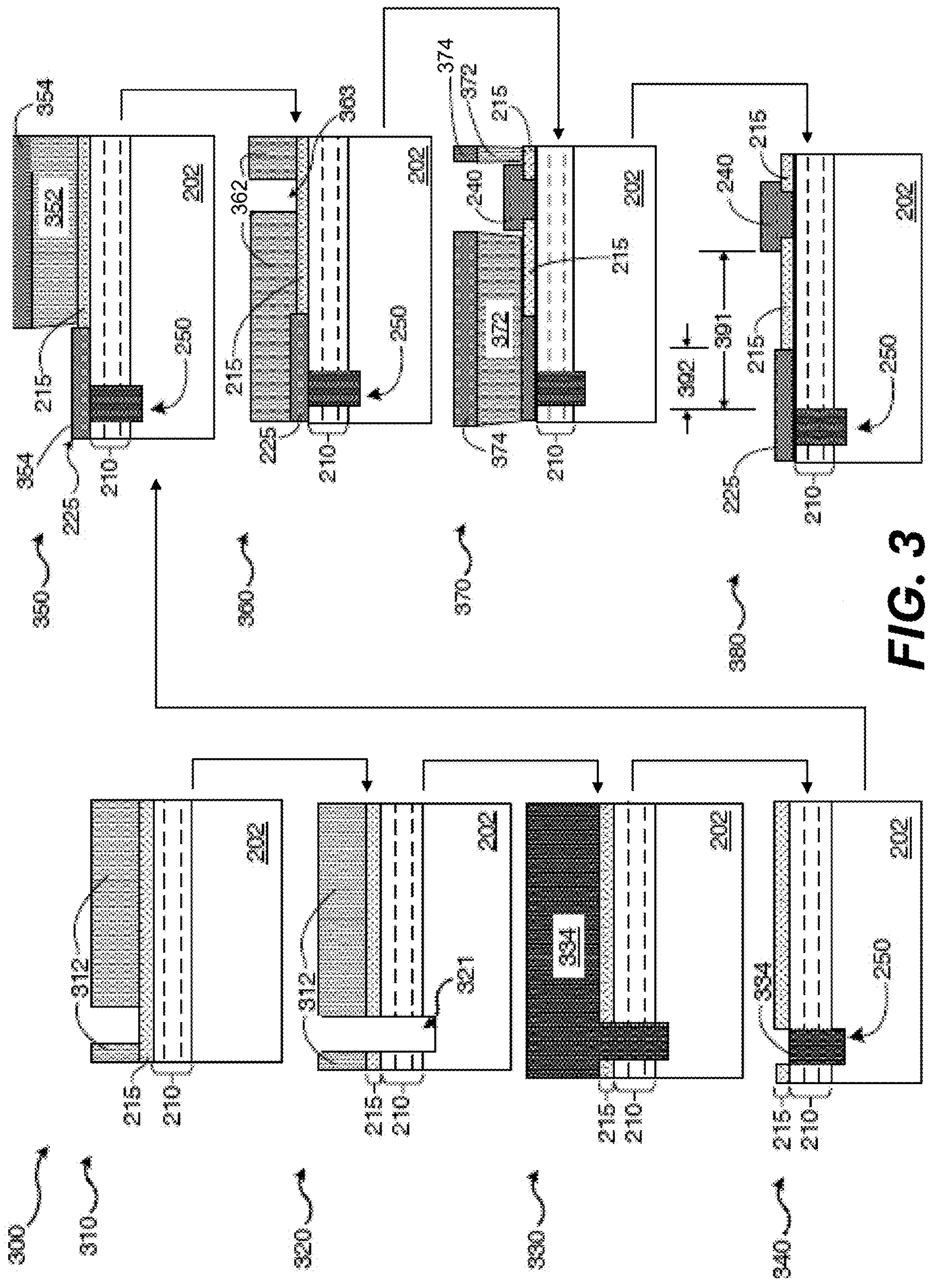
FIG. 3 is schematic diagram illustrating steps in an example process according to embodiments herein for fabricating the transistor of FIGS. 2A and 2B and related transistors.

FIG. 3 is a process flow diagram representing steps in an example process 300 suitable for use in fabricating devices with one or more cooling trenches (e.g., cooling trenches 250) according to embodiments herein (e.g., the example transistor 200). It will be understood that certain details, such as details of well-known semiconductor fabrication process, may be omitted for clarity and that multiple discrete steps may be represented in one step. It will be further understood that, in or more embodiments, steps of the example process 300 described herein may be omitted or perform ed in a different order. Furthermore, it will be understood that although reference may be made to photoresist, that nothing herein is intended to exclude other techniques such as electron beam lithography, as one nonlimiting example.

As shown, the example process 300 includes steps 310, 320, 330, 340, 350, 360, 370, and 380. These steps are depicted in FIG. 3 being performed to fabricate the transistor 200 of FIG. 2A and FIG. 2B. Since a transistor according to embodiments herein such as the transistor 200 may have a cooling trench 250 on only one side of the gate electrode 240 or on both sides, only one side of the transistor 200 is depicted (i.e., a portion that includes the contact 225 and the gate electrode 240 but omits the area between the gate electrode 240 and the contact 235). It will be understood that in embodiments where a cooling trench is provided on either or both sides of a gate electrode (e.g., as part of the both the source terminal 220 and the drain terminal 230 of the transistor 200), a cooling trench 250 under the contact 235 may be formed as shown for the cooling trench 250 under the contact 225.

At step 310, a semiconductor substrate (e.g., the substrate 202) is provided with a region suitable for use as a channel region at the top surface (e.g., a semiconductor heterostructure such as a channel region 110 or channel region 210). The dielectric material 215 is also present above the channel region 210. A masking material 312 (e.g., photoresist, dielectric material, or a conductive material) is patterned above the dielectric material 215 and the channel region 210, using any suitable process including well-known semiconductor lithography techniques as nonlimiting examples.

At step 320, an open cavity 321 is etched through the dielectric material 215, the channel region 210, and through a portion of the substrate 202 as shown using any suitably anisotropic etching process, including one or more dry plasma etching processes and/or one or more wet chemical etching processes that can be chosen based in part on the composition and microstructure of the dielectric material 215, the channel region 210, and the substrate 202.

At step 330, the masking material 312 is stripped away and a suitably conductive material 334 is deposited above the entire device area of the substrate 202, filling the cavity 321 formed at step 320, as shown. The conductive material 334 is thermally conductive and in one or more embodiments, the conductive material 334 is electrically conductive, highly resistive, semiconductive, or electrically nonconductive. In or more embodiments, as shown (e.g., in a HEMT such as the transistor 200 with a heterostructure-based channel region 210, the conductive material 334 is both thermally and electrically conductive and configured such that current applied to the contact 225 (see FIG. 2A) flows through the electrically conductive material of a cooling trench to a conductive current path within a channel region (e.g., a 2DEG formed at a buried interface of a semiconductor heterostructure channel region such as the channel region 110 or channel region 210).

At step 340, the conductive material 334 has been selectively removed from above the dielectric material 215, leaving only the cooling trench 250 filled with the conductive material 334 as shown. The conductive material 334 can be removed using any suitable processes including, as nonlimiting examples, sputter etching, reactive ion etching, wet chemical etching, chemical mechanical polishing (CMP), and the like; and any suitable combination of two or more such processes.

At step 350, a masking material 352 (e.g., photoresist) is formed and patterned above the substrate 202. The dielectric material 215 is removed from areas that are not protected by the masking material 352 and then an electrically conductive material 354 is deposited over the entire device area, as shown. A portion of the conductive material 354 that is deposited over the cooling trench 250 forms the contact 225. As shown, the masking material 352 may have angled sidewalls to facilitate patterning the conductive material 354 using a lift-off process. The residual masking material 352 is stripped, removing any of the undesired conductive material 354, leaving the conductive material 354 behind in the cooling trench 250.

At step 360, a masking material 362 (e.g., photoresist) is patterned above the substrate 202 to leave an opening 363 through which the dielectric material 215 is removed using any suitable process, including as nonlimiting examples a sputter etching process, a reactive ion etching process, and a wet chemical etching process. In some embodiments, a wet chemical etching process is used to avoid damage to the underlying channel region 210.

At step 370, a masking material 372 (e.g., photoresist) is formed and patterned above the substrate 202 and an electrically conductive material 374 is deposited over the masking material 372. As shown, the masking material 372 may have angled sidewalls to facilitate patterning the conductive material 374 using a lift-off process. The residual masking material 372 is stripped, removing any of the undesired conductive material 374, leaving the electrically conductive material 374 behind to form the gate electrode 240.

Finally, at step 380, In one or more embodiments in which a gate electrode lacks the T-shaped profile of the gate electrode 240, the gate electrode can be formed by depositing conductive material such as the conductive material 374 over the masking material 362 at step 370 and step 380 is omitted.

It will be understood, that, in one or more embodiments, the positioning of a cooling trench may vary from the positioning of the cooling trench 250 in FIG. 3. For instance, any suitable offset between the edge of a cooling trench (as indicated by the offset dimension 391 shown at step 380) may be used to achieve desired performance characteristics or to accommodate process requirements. Similarly, in one or more embodiments, the positioning of the cooling trench relatively to an edge of a contact such as the contact 225 or the contact 235 (as indicated by the offset dimension 392 shown at step 380) may be used to achieve desired performance characteristics or to accommodate process requirements.

It will be understood that, although the patterning of various layers (e.g., the conductive material 334, the electrically conductive material 354, and the electrically conductive material 374) may be described according to an additive process such as lift-off, that any suitable processes may be used, including, but not limited to processes in which a conductive material is first deposited over an entire area and then patterned substantively through a masking material using an etch process or any other suitable process.

As indicated above, modifying a transistor such as the example transistor 100 to include one or more cooling trenches according to embodiments herein can be used to reduce current induced heating in gallium nitride HEMTs and related device. For instance, combined electrical and thermal simulations have shown that the peak temperature in the channel region of a particular gallium nitride HEMT design can be reduced from approximately 260° C. to less than 200° C. when a tungsten-filled cooling trench (e.g., a cooling trench 250) is added beneath the source terminal (e.g., the source terminal 220. Such improvements in thermal characteristics can enable increased density in multi-transistor integrated circuits, improved device reliability, and other benefits. For example, in a simulated gallium nitride HEMT with a single source side cooling trench, breakdown voltage increased by up to ~35% with increasing depth of the cooling trench from 0 (no trench) to 5 μm and gate leakage current was reduced at the expense of a moderate increase in drain-to-source capacitance (less than ~10%). Addition of a drain-side cooling trench can produce additional heat transfer improvements but may also tend to counter-act some of the performance benefits seen in the device with a source-side cooling trench only. However, performance tradeoffs can be optimized by using a comparatively deep cooling trench on the source side and a shallower cooling trench on the drain side.

In examples herein, the thermal performance of cooling trenches with a depth of 500 nm were simulated. In general, for HEMT devices with cooling trenches according to embodiment it is desirable for a cooling trench to extend at least far enough into a substrate to contact a nucleation layer of a heterostructure such as the nucleation layer 110*a* of the heterostructure 110.

Figure 4:
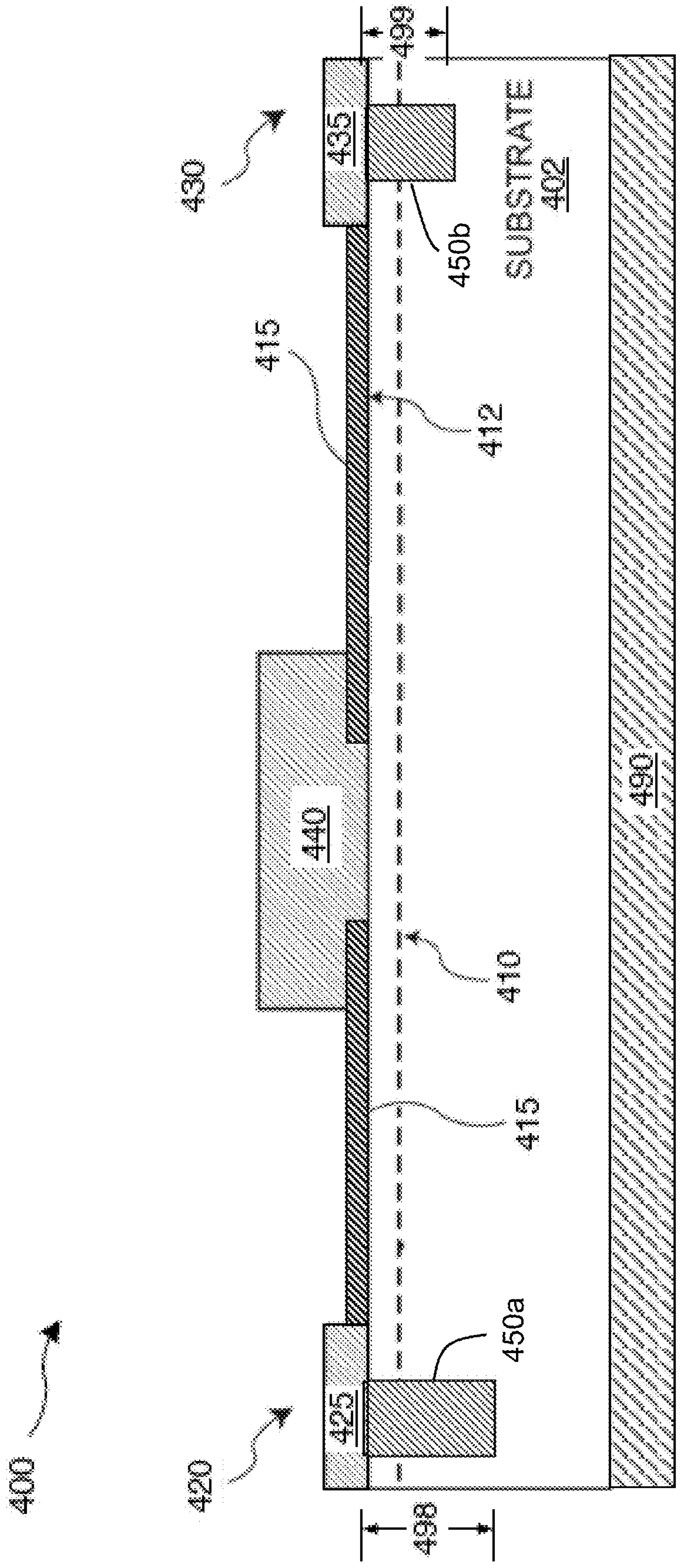
FIG. 4 is a cross-sectional schematic view of another example transistor that is provided with one or more cooling trenches according to embodiments herein.

FIG. 4 is a schematic cross-sectional view of an example transistor 400 that is related to the example transistor 200 of as shown in FIG. 2A, FIG. 2B and FIG. 3. The example transistor 400 is formed on a substrate 402 (e.g., the substrate 202) and has a channel region 410 (e.g., a heterostructure-based channel region 210) with a top surface 412 and a dielectric material 415 (e.g., the dielectric material 115 or the dielectric material 215) above the top surface 412 of the channel region 410. The example transistor 400 also has a source terminal 420 with a source contact 425 (e.g., the contact 225), a drain terminal 430 with a contact 435 (e.g., the contact 225), and a gate electrode 440 (e.g., the gate electrode 240). The example transistor 400 also has two cooling trenches 450 (e.g., cooling trenches 250), a source-side cooling trench 450*a* with a depth indicated by the dimension 498 and a drain-side cooling trench 450*b* with a depth indicated by the dimension 499. In one or more embodiments, as a shown, a transistor has one or more cooling trenches on a first (source terminal) side of the gate electrode (e.g., a source-side cooling trench 450*a*) with a first depth and one or more cooling trenches on a second (drain terminal) side of the gate electrode (e.g., a drain-side cooling trench 450*b*) with a second dept that is less than the first depth.

Features of embodiments may be understood by way of one or more of the following examples:

Example 1: A semiconductor device or method of fabricating a semiconductor device that includes a transistor provided with a first elongated cooling structure. The transistor is formed on or within an electrically-insulating semiconductor substrate having a top surface and a bottom surface. The transistor has a first current terminal; a second current terminal; and a channel region formed above the top surface of the semiconductor substrate that is configured to provide an electrically conductive path between the first current terminal and the second current terminal. The transistor also has an elongated gate electrode disposed above the channel region that extends laterally from a first end of the gate electrode to a second end of the gate electrode in a first direction that is parallel to the top surface of the semiconductor substrate.

The first elongated cooling trench is coupled to the first current terminal, and the first elongated cooling trench extends laterally from a first end of the first elongated cooling trench to a second end of the first elongated cooling trench along the first direction, and the first elongated cooling trench also extends vertically from the first current terminal through the channel region, through the top surface of the semiconductor substrate and toward, but not to, the backside of the semiconductor substrate. The first elongated cooling trench is filled throughout with a thermally-conductive material configured to dissipate heat from the channel region into the semiconductor substrate.

Example 2: The device or method of Example 1, where the first current terminal includes an electrode coupled to the first current terminal and to the thermally-conductive material of the first elongated cooling trench.

Example 3: The method or device of Example 1 or Example 2 in which the thermally-conductive material of the first elongated cooling trench is a metal.

Example 4: The method or device of any of Examples 1-3, further including a backside metallization layer 290 on a bottom surface of the semiconductor substrate. The metal of the first elongated cooling trench does not physically contact the backside metallization layer 290.

Example 5: The method or device of any of Examples 2-4, that further includes a second elongated cooling trench coupled to the second current terminal that extends laterally from a first end to a second end of the second elongated cooling trench along the first direction and extends vertically from the second current terminal and through the top surface into the semiconductor substrate.

Example 6: The method or device of Example 5 in which the thermally-conductive material of the first elongated cooling trench extends vertically into the semiconductor substrate to a first depth that is less than a thickness of the semiconductor substrate and thermally-conductive material of the second elongated cooling trench extends vertically into the semiconductor substrate to a second depth that is less than the first depth.

Example 7: The method or device of Example 5 or Example 6, in neither the metal of the first elongated cooling trench nor the metal of the second elongated cooling trench physically contacts the backside metallization layer 290.

Example 8: The method or device of any of Examples 1-7, in which the channel region includes a semiconductor heterostructure configured to form a two-dimensional electron gas (2DEG) at a buried semiconductor heterojunction within the semiconductor heterostructure.

Example 9: The method or device of any of Examples 1-8, in which, when the transistor is biased in an on state in which electrical current flows between the first current terminal and the second terminal via the channel region, at least a portion of the electrical current flows from the first current terminal to the channel region through the first elongated cooling trench.

Example 10: The method or device of any of Examples 1-9, in which a cooling trench extends within the semiconductor substrate to a depth that is beyond a depth of a semiconductor heterostructure forming the channel region.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent example functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one example arrangement of elements, additional intervening elements, devices, features, or components may be present in one or more embodiments of the depicted subject matter.

What is claimed is:

1. A transistor comprising:

a semiconductor substrate having a top surface and a backside;

a first current terminal that has a first contact that directly contacts the top surface of the semiconductor substrate, wherein the first current terminal is selected from one of a source terminal and a drain terminal;

a second current terminal that has a second contact, wherein the second current terminal is selected from another one of the source terminal and the drain terminal;

a semiconductor heterostructure including a channel region formed on the top surface of the semiconductor substrate, wherein the semiconductor heterostructure has a top surface, wherein the first and second contacts are supported by and located at the top surface of the semiconductor heterostructure, and wherein the channel region is configured to provide an electrically conductive path between the first current terminal and the second current terminal;

an elongated gate electrode at the top surface of the semiconductor heterostructure between the first and second contacts, wherein the gate electrode extends laterally from a first end of the gate electrode to a second end of the gate electrode in a first direction that is parallel to the top surface of the semiconductor substrate; and a first elongated cooling trench directly below and directly physically connected to the first contact of the first current terminal, wherein the first elongated cooling trench extends laterally from a first end of the first elongated cooling trench to a second end of the first elongated cooling trench along the first direction, and the first elongated cooling trench also extends vertically from the first contact of the first current terminal through the channel region and through the semiconductor heterostructure, through the top surface of the semiconductor substrate and toward, but not to, the backside of the semiconductor substrate;

wherein the first elongated cooling trench is filled throughout with a thermally-conductive material configured to dissipate heat from the channel region into the semiconductor substrate, the first elongated cooling trench is not configured to convey current from the first current terminal to the backside of the semiconductor substrate, and the first elongated cooling trench is not configured to be in electrical communication with the backside of the semiconductor substrate.

2. The transistor of claim 1, wherein the thermally-conductive material of the first elongated cooling trench is a metal.

3. The transistor of claim 1, further comprising a backside metallization layer on the backside of the semiconductor substrate;

wherein the first elongated cooling trench does not physically contact the backside metallization layer.

4. The transistor of claim 1, wherein the transistor is a high electron mobility transistor (HEMT) and the channel region comprises the semiconductor heterostructure, which is configured to form a two-dimensional electron gas (2DEG) at a buried semiconductor heterojunction within the semiconductor heterostructure between the top surface of the channel region and the top surface of the semiconductor substrate.

5. The transistor of claim 1, wherein, when the transistor is biased in an on state in which electrical current flows between the first current terminal and the second terminal via the channel region, at least a portion of the electrical current flows from the first current terminal to the channel region through the first elongated cooling trench.

6. The transistor of claim 1, wherein the first contact is formed from an electrically-conductive material that is different from the thermally-conductive material of the first elongated cooling trench.

7. The transistor of claim 1, wherein the thermally-conductive material of the first elongated cooling trench is a solid mass that provides a high thermal conductivity path from the channel region to the semiconductor substrate.

8. The transistor of claim 1, wherein the thermally-conductive material of the first elongated cooling trench includes multiple layers.

9. The transistor of claim 1, wherein the first elongated cooling trench has an aspect ratio of at least 5.

10. The transistor of claim 1, wherein the thermally-conductive material of the first elongated cooling trench includes one or more materials selected from a group consisting of gold, tungsten, copper, aluminum, titanium, and alloys thereof.

11. The transistor of claim 1, wherein the first elongated cooling trench extends to a depth of at least 100 nanometers beyond the top surface of the semiconductor substrate.

12. A transistor comprising:

a semiconductor substrate having a top surface and a backside;

a source terminal that has a first contact that directly contacts the top surface of the semiconductor substrate;

a drain terminal that has a second contact that directly contacts the top surface of the semiconductor substrate;

a semiconductor heterostructure including a channel region formed on the top surface of the semiconductor substrate, wherein the semiconductor heterostructure has a top surface, wherein the source and drain contacts are supported by and located at the top surface of the semiconductor heterostructure, and wherein the channel region is configured to provide an electrically conductive path between the source terminal and the drain terminal;

an elongated gate electrode at the top surface of the semiconductor heterostructure between the source and drain contacts, wherein the gate electrode extends laterally from a first end of the gate electrode to a second end of the gate electrode in a first direction that is parallel to the top surface of the semiconductor substrate;

a first elongated cooling trench directly below and directly physically connected to the first contact of the source terminal, wherein the first elongated cooling trench extends laterally from a first end of the first elongated cooling trench to a second end of the first elongated cooling trench along the first direction, and the first elongated cooling trench also extends vertically from the first contact of the source terminal through the channel region and through an entire thickness of the semiconductor heterostructure, through the top surface of the semiconductor substrate and toward, but not to, the backside of the semiconductor substrate; and a second elongated cooling trench directly below and directly physically connected to the second contact of the drain terminal, wherein the second elongated cooling trench extends laterally from a first end of the second elongated cooling trench to a second end of the second elongated cooling trench along the first direction, and the second elongated cooling trench also extends vertically from the second contact of the drain terminal through the channel region and through the entire thickness of the semiconductor heterostructure, through the top surface of the semiconductor substrate and toward, but not to, the backside of the semiconductor substrate, wherein the first and second elongated cooling trenches are filled throughout with a thermally-conductive material configured to dissipate heat from the channel region into the semiconductor substrate.

13. The transistor of claim 12, wherein the thermally-conductive material of the first elongated cooling trench extends vertically into the semiconductor substrate to a first depth that does not reach the backside of the semiconductor substrate, and thermally-conductive material of the second elongated cooling trench extends vertically into the semiconductor substrate to a second depth that is less than the first depth.

14. The transistor of claim 13, further comprising:

a backside metallization layer on a bottom surface of the semiconductor substrate;

wherein neither the thermally-conductive material of the first elongated cooling trench nor the thermally-conductive material of the second elongated cooling trench physically contacts the backside metallization layer.

15. The transistor of claim 14, wherein:

the first elongated cooling trench is not configured to convey current from the source terminal to the backside metallization layer, and the first elongated cooling trench is not configured to be in electrical communication with the backside metallization layer; and the second elongated cooling trench is not configured to convey current from the drain terminal to the backside metallization layer, and the second elongated cooling trench is not configured to be in electrical communication with the backside metallization layer.

16. A method of fabricating a transistor, the method comprising:

providing a semiconductor substrate, wherein the substrate has a top surface and a backside;

forming a semiconductor heterostructure including a channel region on the top surface of the semiconductor substrate, wherein the semiconductor heterostructure has a top surface;

forming a first elongated cooling trench that extends laterally from a first end of the first elongated cooling trench to a second end of the first elongated cooling trench along a first direction that is parallel to the top surface of the semiconductor substrate, and wherein the first elongated cooling trench also extends vertically from the top surface of the channel region through the channel region and through the semiconductor heterostructure, through the top surface of the semiconductor substrate and toward, but not to, the backside of the semiconductor substrate;

filling the first elongated cooling trench throughout with a thermally-conductive material configured to dissipate heat from the channel region into the semiconductor substrate, wherein, once filled with the thermally-conductive material, the first elongated cooling trench is not configured to be in electrical communication with the backside of the semiconductor substrate;

forming a first current terminal with a first contact that directly contacts the top surface of the semiconductor heterostructure, wherein the first current terminal is selected from one of a source terminal and a drain terminal, the first contact is directly above and directly physically connected to the first elongated cooling trench, and the first elongated cooling trench is not configured to convey current from the first current terminal to the backside of the semiconductor substrate, and;

forming a second current terminal with a second contact at the top surface of the semiconductor heterostructure, wherein the second current terminal is selected from another one of the source terminal and the drain terminal, and the channel region is configured to provide an electrically conductive path between the first contact and the second contact; and forming an elongated gate electrode at the top surface of the semiconductor heterostructure between the first and second contacts, wherein the gate electrode extends laterally from a first end of the gate electrode to a second end of the gate electrode in the first direction.

17. The method of claim 16, wherein the first elongated cooling trench does not physically contact a backside metallization layer disposed on the backside of the semiconductor substrate.

18. The method of claim 16, further comprising:

forming a second elongated cooling trench directly below and directly physically connected to the second contact of the second current terminal, wherein the second elongated cooling trench extends laterally from a first end of the second elongated cooling trench to a second end of the second elongated cooling trench along the first direction, and the second elongated cooling trench also extends vertically from the second contact of the second current terminal through the channel region and through the semiconductor heterostructure, through the top surface of the semiconductor substrate and toward, but not to, the backside of the semiconductor substrate.

19. The method of claim 16, wherein the channel region comprises the semiconductor heterostructure configured to form a two-dimensional electron gas (2DEG) at a buried semiconductor heterojunction within the semiconductor heterostructure.

* * * * *